(12) United States Patent
You

(10) Patent No.: US 10,319,931 B2
(45) Date of Patent: Jun. 11, 2019

(54) LIGHT EMITTING DEVICE, METHOD FOR MANUFACTURING LIGHT EMITTING DEVICE, AND DISPLAY DEVICE

(71) Applicant: BOE TECHNOLOGY GROUP CO., LTD., Beijing (CN)

(72) Inventor: Juanjuan You, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,527

(22) PCT Filed: Jun. 3, 2016

(86) PCT No.: PCT/CN2016/084704
§ 371 (c)(1),
(2) Date: May 25, 2017

(87) PCT Pub. No.: WO2017/161694
PCT Pub. Date: Sep. 28, 2017

(65) Prior Publication Data
US 2018/0190925 A1    Jul. 5, 2018

(30) Foreign Application Priority Data
Mar. 23, 2016 (CN) .......................... 2016 1 0170235

(51) Int. Cl.
*H01L 51/50* (2006.01)
*H01L 51/56* (2006.01)
*H01L 51/00* (2006.01)

(52) U.S. Cl.
CPC ...... *H01L 51/5024* (2013.01); *H01L 51/0008* (2013.01); *H01L 51/50* (2013.01);
(Continued)

(58) Field of Classification Search
CPC ..... H01L 51/50; H01L 51/5024; H01L 51/56; H01L 51/0008; H01L 51/5004;
(Continued)

(56) References Cited

U.S. PATENT DOCUMENTS 8,227,789 B2    7/2012  Hirayama et al.
10,074,815 B2 *  9/2018  Forrest ............... H01L 51/0085
(Continued)

FOREIGN PATENT DOCUMENTS

CN    1475035 A    2/2004
CN    1628491 A    6/2005
(Continued)

OTHER PUBLICATIONS

Search Report for International Patent Application No. PCT/CN2016/084704 dated Jan. 6, 2017.
(Continued)

*Primary Examiner* — Fazli Erdem
(74) *Attorney, Agent, or Firm* — Calfee, Halter & Griswold LLP

(57) ABSTRACT

A light emitting device includes: a first electrode, a second electrode and an electroluminescent layer (EL) interposed between the first electrode and the second electrode, the EL including an emitting material layer (EML) and an electron blocking layer (EBL), wherein the EML includes a first base material doped with a first guest material, and the EBL includes a second base material doped with a second guest material.

18 Claims, 3 Drawing Sheets

(52) U.S. Cl.
CPC ........ *H01L 51/5004* (2013.01); *H01L 51/504* (2013.01); *H01L 51/5016* (2013.01); *H01L 51/5056* (2013.01); *H01L 51/5096* (2013.01); *H01L 51/56* (2013.01); *H01L 2251/552* (2013.01)

(58) Field of Classification Search
CPC ............... H01L 51/5016; H01L 51/504; H01L 51/5056; H01L 51/5096
USPC .......................................................... 257/40
See application file for complete search history.

(56) References Cited

U.S. PATENT DOCUMENTS

| | | | | |
|---|---|---|---|---|
| 2009/0191427 | A1* | 7/2009 | Liao | H01L 51/5096 428/690 |
| 2010/0133522 | A1* | 6/2010 | Pieh | H01L 27/3209 257/40 |
| 2010/0187552 | A1 | 7/2010 | Lee et al. | |
| 2012/0193617 | A1 | 8/2012 | Urano et al. | |
| 2012/0219395 | A1 | 8/2012 | Inaguma et al. | |
| 2013/0153881 | A1* | 6/2013 | Tokoo | H01L 51/5016 257/40 |
| 2015/0295198 | A1* | 10/2015 | Xu | H01L 51/504 257/40 |
| 2016/0293864 | A1* | 10/2016 | Forrest | H01L 51/0085 |

FOREIGN PATENT DOCUMENTS

| | | |
|---|---|---|
| CN | 102245543 A | 11/2011 |
| CN | 102668160 A | 9/2012 |
| CN | 103227294 A | 7/2013 |
| CN | 103730590 A | 4/2014 |
| CN | 103887444 A | 6/2014 |
| CN | 104270847 A | 1/2015 |
| CN | 104576953 A | 4/2015 |
| CN | 105140360 A | 12/2015 |
| CN | 105190928 A | 12/2015 |
| CN | 105576146 A | 5/2016 |
| EP | 2495229 A1 | 9/2012 |
| EP | 2495229 B1 | 6/2016 |
| TW | 201023413 A | 6/2010 |

OTHER PUBLICATIONS

First Office Action for Chinese Patent Application No. 201610170235.4 dated Feb. 4, 2017.
Supplementary European Search Report for Application No. EP 10 82 6830 dated Jul. 10, 2013.

* cited by examiner

LIGHT EMITTING DEVICE, METHOD FOR MANUFACTURING LIGHT EMITTING DEVICE, AND DISPLAY DEVICE

CROSS REFERENCE

The present application is based upon International Application No. PCT/CN2016/084704, filed on Jun. 3, 2016, which is based upon and claims priority to Chinese Patent Application No. 201610170235.4, filed on Mar. 23, 2016, and the entire contents thereof are incorporated herein by reference.

TECHNICAL FIELD

The present disclosure relates to the field of display technology, in particular, to a light emitting device, a method for manufacturing the light emitting device, and a display device.

BACKGROUND

In the conventional organic light emitting diode (OLED) display device, the lifespan of blue light emitting devices is still a decisive factor in determine the lifespan of the display device regardless in a side-by-side structure or a white organic light emitting diode (WOLED) plus color filter (WOLED-CF) structure.

A light emitting device in the OLED display device may comprise a multilayer structure of emitting material layer (EML), an electron blocking layer (EBL), a hole transport layer (HTL), and the like. High energy excitons may be easily concentrated in the EML especially in blue light emitting devices. In order to release the energy of the excitons in the form of light in time, a blue light emitting material is usually doped in the EML.

However, some of the excitons may be transferred into the EBL before they emit light, and if the energy of the excitons in the EBL is not released in the form of light in time, the excitons may enter the HTL and cause decomposition reaction of the martial of the HTL, thereby affecting the stability of the light emitting device and reducing the lifespan of the light emitting device.

It should be noted that, information disclosed in the above background portion is provided only for better understanding of the background of the present disclosure, and thus it may contain information that does not form the prior art known by those ordinary skilled in the art.

SUMMARY

The present disclosure provides a light emitting device, a method for manufacturing the light emitting device, and a display device.

For the above objectives, the present disclosure provides a light emitting device comprising a first electrode, a second electrode and an electroluminescent layer (EL) interposed between the first electrode and the second electrode, the EL comprising an emitting material layer (EML) and an electron blocking layer (EBL), wherein the EML comprises a first base material doped with a first guest material;

the EBL comprises a second base material doped with a second guest material, wherein the first guest material and the second guest material are both light emitting materials.

For the above objectives, the present disclosure provides a display device comprising the above light emitting device.

For the above objectives, the present disclosure provides a method for manufacturing a light emitting device, comprising:

forming an electroluminescent layer (EL) comprising an emitting material layer (EML) and an electron blocking layer (EBL) on a first electrode, the EML comprising a first base material doped with a first guest material and the EBL comprising a second base material doped with a second guest material; and forming a second electrode on the EL.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

DETAILED DESCRIPTION

Hereinafter, the light emitting device, the method for manufacturing the light emitting device, and the display device according to the present disclosure will be described in further detail with reference to the accompanying drawings, such that those skilled in the art may have a better understanding of the implementations of the present disclosure.

Figure 1:
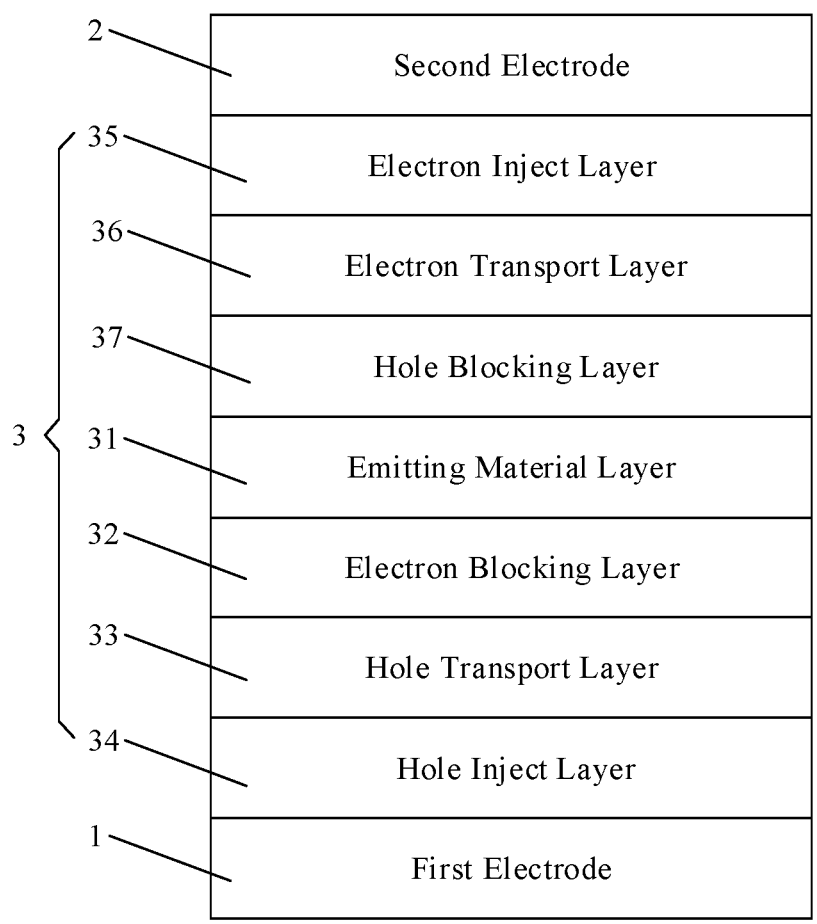
FIG. 1 is a structural schematic diagram of a light emitting device according a first embodiment of the present disclosure.

FIG. 1 is a structural schematic diagram of a light emitting device according a first embodiment of the present disclosure. As illustrated in FIG. 1, the light emitting device comprises: a first electrode 1, a second electrode 2 and an electroluminescent layer (EL) 3 interposed between the first electrode 1 and the second electrode 2. The EL 3 comprises an emitting material layer (EML) 31 and an electron blocking layer (EBL) 32. The EML 31 comprises a first base material doped with a first guest material BD1, and the EBL 32 comprises a second base material doped with a second guest material BD2.

In the present embodiment, the EBL 32 is disposed on the first electrode 1, the EML 31 is disposed on the EBL 32, and the second electrode 2 is disposed on the EML 31.

Further, the EL 3 further comprises a hole transport layer (HTL) 33 and a hole inject layer (HIL) 34. The HTL 33 and the HIL 34 are both interposed between the first electrode 1 and the EBL 32. In particular, the HIL 34 is disposed on the first electrode 1, and the HTL 33 is disposed on the HIL 34.

Further, the EL 3 further comprises an electron inject layer (EIL) 35 and an electron transport layer (ETL) 36. The ETL 36 is disposed on the EML 31, and the EIL 35 is disposed on the ETL 36.

Further, the EL 3 further comprises a hole blocking layer (HBL) 37. The HBL 37 is disposed on the EML 31 and under the ETL 36.

In the present embodiment, the first guest material BD1 has a wavelength (i.e., a wavelength of the light that may be emitted from the first guest material BD1) smaller than that of the second guest material BD2. For example, the first guest material BD1 has a wavelength of 454 nm, and the second guest material BD2 has a wavelength of 457 nm. In other words, the first guest material BD1 may be referred to as a dark blue material, and the second guest material BD2 may be referred to as a light blue material.

Optionally, the first guest material BD1 has an energy band width Eg(BD1) larger than an energy band width Eg(BD2) of the second guest material, i.e., Eg(BD1)>Eg(BD2).

Optionally, the second base material has a triplet level $E_T(EBL)$ higher than a triplet level $E_T(BD2)$ of the first guest material, and the triplet level $E_T(EBL)$ of the second base material is higher than a triplet level $E_T(BD1)$ of the first base material, i.e, $E_T(EBL)>E_T(BD2)$, and $E_T(EBL)>E_T(BD1)$.

Optionally, HTL 33 has a highest occupied molecular orbit (HOMO) energy HOMO(HTL) higher than the HOMO energy HOMO(EBL) of the EBL 32, and the HOMO energy HOMO(EBL) of the EBL 32 is higher than the HOMO energy HOMO(EML) of the EML 31, i.e., HOMO(HTL)>HOMO(EBL)>HOMO(EML).

Optionally, a difference between the HOMO energy HOMO(EBL) of the EBL 32 and HOMO(ETL) of the HTL 33 is equal to or smaller than 0.4 eV, i.e., HOMO(EBL)−HOMO(HTL)≤0.4 eV; and a difference between the HOMO energy HOMO(EML) of the EML 31 and the HOMO energy HOMO(EBL) of the EBL 32 is equal to or smaller than 0.4 eV, i.e., HOMO(EML)−HOMO(EBL)≤0.4 eV.

In the present embodiment, the second guest material BD2 has a dopant concentration of 1% to 5%. Optionally, the second guest material BD2 has a dopant concentration of 3%.

In the present embodiment, the first guest material BD1 has a dopant concentration of 3% to 10%. Optionally, the first guest material BD1 has a dopant concentration of 5%.

In the present embodiment, the EBL 32 has a thickness between 5 nm to 20 nm. Optionally, the EBL 32 has a thickness between 10 nm to 15 nm. Optionally, the EBL 32 has a thickness of 10 nm.

In the present embodiment, the first electrode may be configured as an anode, and the second electrode may be configured as a cathode. The first electrode may comprise a transparent conductive material such as ITO, and the second electrode may comprise a metal such as Al.

In the present embodiment, the light emitting device is a blue light emitting device. In this case, the first guest material and the second guest material are both blue light emitting materials. Since the wavelength of the first guest material is smaller than that of the second guest material, the first guest has an emission color deeper than that of the second guest material. Correspondingly, the first guest material may be referred to as "dark blue light emitting material", and the second guest material may be referred to as "light blue light emitting material". In different applications, the light emitting device may be a light emitting device of other colors, and the first guest material and the second guest material are light emitting materials of corresponding colors.

Figure 2:
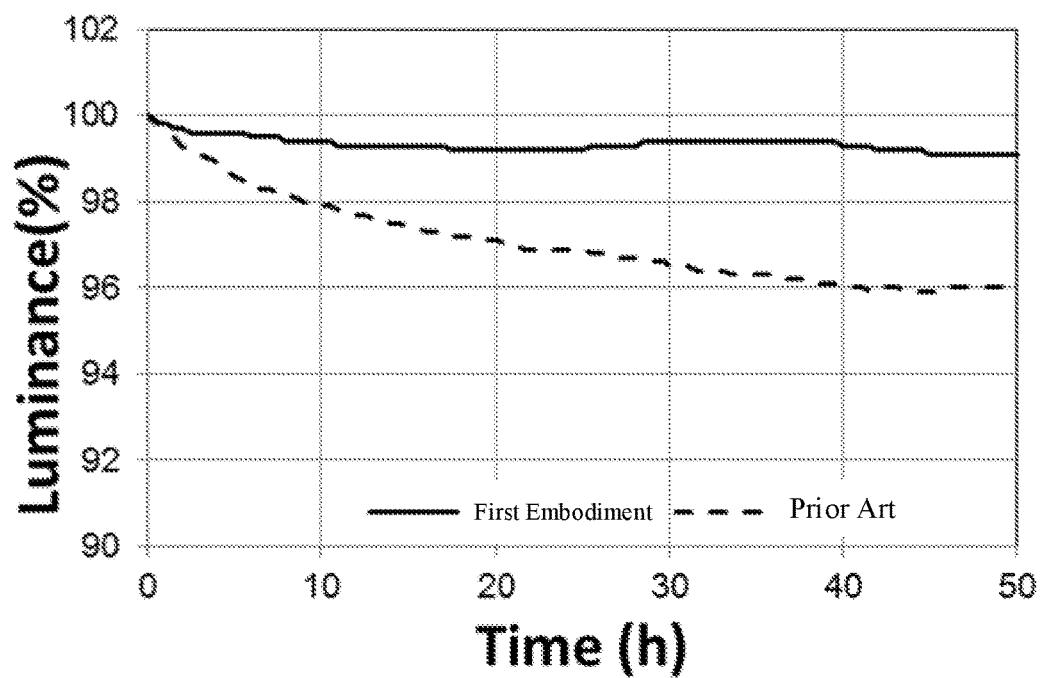
FIG. 2 is a schematic view illustrating a comparison of the luminance percentage of the light emitting device according to the first embodiment of the present disclosure and that of the light emitting device in the prior art.

FIG. 2 is a schematic view illustrating a comparison of the luminance percentage of the light emitting device according to the first embodiment of the present disclosure and that of the light emitting device in the prior art. As illustrated in FIG. 2, as the time (Time) increases, the luminance percentage (Luminance) of the light emitting device according to the first embodiment has no significant decrease, while the luminance percentage (Luminance) of the light emitting device in the prior art has a significant decrease. Accordingly, the light emitting device according to the first embodiment may have a lifespan longer than that of the light emitting device in the prior art.

In the implementations of the light emitting device according to the present embodiment, the second base material of the EBL is doped with the second guest material, and the second guest material may release the energy of the excitons in the EBL in the form of light, thereby improving the stability of the light emitting device, and improving the lifespan of the light emitting device. In the present embodiment, the energy of the excitons in the EBL may be released in the form of light, thereby increasing the light emitting efficiency of the light emitting device.

A second embodiment of the present disclosure provides a display device comprising a light emitting device. The light emitting device may be configured as the light emitting device according to the above first embodiment.

In the implementations of the display device according to the present embodiment, the second base material of the EBL is doped with the second guest material, and the second guest material may release the energy of the excitons in the EBL in the form of light, thereby preventing the decomposition reaction of the martial of the HTL caused by the excitons, improving the stability of the light emitting device, and improving the lifespan of the light emitting device.

Figure 3:
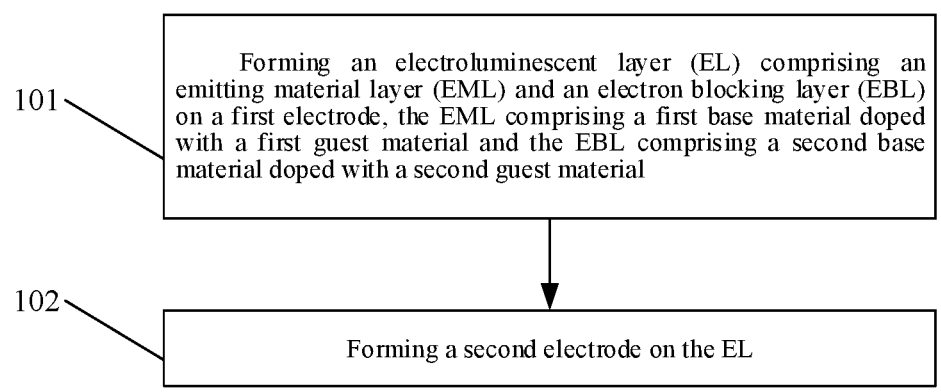
FIG. 3 is a flow chart illustrating a method for manufacturing a light emitting device according to a third embodiment of the present disclosure.

FIG. 3 is a flow chart illustrating a method for manufacturing a light emitting device according to a third embodiment of the present disclosure. As illustrated in FIG. 3, the method comprises the steps that follow.

In step 101, an electroluminescent layer (EL) comprising an emitting material layer (EML) and an electron blocking layer (EBL) is formed on a first electrode, wherein the EML comprises a first base material doped with a first guest material and the EBL comprises a second base material doped with a second guest material.

In the present embodiment, the first electrode may be formed of a transparent conductive material such as ITO.

Further, the EL further comprises an HTL, an HIL, an EIL, an ETL and an HBL.

In particular, the step 101 may comprise the steps that follow.

In step 1011, the HIL is evaporated on the first electrode at a fifth set evaporating rate.

Optionally, the fifth set evaporating rate is 1 Å/s. The HIL may have a thickness of 10 nm.

In step 1012, the HTL is evaporated on the HIL at a sixth set evaporating rate.

Optionally, the sixth set evaporating rate is 1 Å/s. The HTL may have a thickness of 120 nm.

In step 1013, the EBL is formed on the HTL by evaporating the second base material at a first set evaporating rate and the second guest material at a second set evaporating rate.

Optionally, the first set evaporating rate is 1 Å/s, the second set evaporating rate is 0.03 Å/s, and the EBL has a thickness of 10 nm.

In step 1014, the EML is formed on the EBL by evaporating the first base material at a third set evaporating rate and the first guest material at a fourth set evaporating rate.

Optionally, the third set evaporating rate is 1 Å/s, the fourth set evaporating rate is 0.5 Å/s, and the EML has a thickness of 25 nm.

In step 1015, the HBL is evaporated on the EML at a seventh set evaporating rate.

Optionally, the seventh set evaporating rate is 1 Å/s, and the HBL has a thickness of 15 nm.

In step 1016, the ETL is evaporated on the HBL at an eighth set evaporating rate.

Optionally, the eighth set evaporating rate is 1 Å/s, and the ETL has a thickness of 10 nm.

In step 1017, the EIL is evaporated on the ETL at a ninth set evaporating rate.

Optionally, the ninth set evaporating rate is 0.1 Å/s, the EIL has a thickness of 1 nm, and the EIL may comprise LiF.

In step 102, a second electrode is formed on the EL.

In particular, the second electrode is evaporated on the EIL at a tenth set evaporating rate. Optionally, the tenth set evaporating rate is 3 Å/s to 5 Å/s. The second electrode has a thickness of 150 nm. The second electrode comprises a metal such as Al.

The method for manufacturing the light emitting device according to the present embodiment may be used to manufacture the light emitting device according to the above first embodiment, and the description of the light emitting device may refer to the above first embodiment, which will not be repeated herein.

In the implementations of the method for manufacturing the light emitting device according to the present embodiment, the second base material of the EBL is doped with the second guest material, and the second guest material may release the energy of the excitons in the EBL in the form of light, thereby preventing the decomposition reaction of the martial of the HTL caused by the excitons, improving the stability of the light emitting device, and improving the lifespan of the light emitting device.

It should be appreciated that, the above embodiments are exemplary implementations for illustrating the principle of the present disclosure only, while the present disclosure is not limited thereto. Various modifications and improvements are possible to those of ordinary skill in the art without departing from the spirit and essence of the present disclosure. All these modifications and improvements will also fall into the protection scope of the present disclosure.

What is claimed is:

1. A light emitting device, comprising a first electrode, a second electrode and an electroluminescent layer (EL) interposed between the first electrode and the second electrode, the EL comprising an emitting material layer (EML) and an electron blocking layer (EBL), wherein:
   the EML comprises a first base material doped with a first guest material,
   the EBL comprises a second base material doped with a second guest material, and
   wherein the first guest material and the second guest material are both light emitting materials, and
   wherein light emitted by the first guest material has a dark blue color, and light emitted by the second guest material has a light blue color.

2. The light emitting device according to claim 1, wherein the first guest material has an energy band width larger than an energy band width of the second guest material.

3. The light emitting device according to claim 1, wherein the second base material has a triplet level higher than a triplet level of the first guest material, and the triplet level of the second base material is higher than a triplet level of the first base material.

4. The light emitting device according to claim 1, wherein the EL further comprises a hole transport layer (HTL) interposed between the first electrode and the EBL; and
   the HTL has a highest occupied molecular orbit (HOMO) energy higher than a HOMO energy of the EBL, and the HOMO energy of the EBL is higher than a HOMO energy of the EML.

5. The light emitting device according to claim 4, wherein a difference between the HOMO energy of the EBL and the HOMO energy of the HTL is equal to or smaller than 0.4 eV, and a difference between the HOMO energy of the EML and the HOMO energy of the EBL is equal to or smaller than 0.4 eV.

6. The light emitting device according to claim 1, wherein the second guest material has a dopant concentration of 1% to 5%.

7. The light emitting device according to claim 6, wherein the dopant concentration of the second guest material is 3%.

8. The light emitting device according to claim 1, wherein the EBL has a thickness between 5 nm to 20 nm.

9. The light emitting device according to claim 8, wherein the thickness of the EBL is between 10 nm to 15 nm.

10. The light emitting device according to claim 1, wherein the light emitting device is a blue light emitting device.

11. A display device comprising a light emitting device, wherein the light emitting device comprises a first electrode, a second electrode and an electroluminescent layer (EL) interposed between the first electrode and the second electrode, the EL comprising an emitting material layer (EML) and an electron blocking layer (EBL), wherein:
    the EML comprises a first base material doped with a first guest material,
    the EBL comprises a second base material doped with a second guest material, and
    wherein the first guest material and the second guest material are both light emitting materials, and
    wherein light emitted by the first guest material has a dark blue color, and light emitted by the second guest material has a light blue color.

12. The display device according to claim 11, wherein the first guest material has an energy band width larger than an energy band width of the second guest material.

13. The display device according to claim 11, wherein the second base material has a triplet level higher than a triplet level of the first guest material, and the triplet level of the second base material is higher than a triplet of the first base material.

14. The display device according to claim 11, wherein the EL further comprises a hole transport layer (HTL) interposed between the first electrode and the EBL; and
    the HTL has a highest occupied molecular orbit (HOMO) energy higher than a HOMO energy of the EBL, and the HOMO energy of the EBL is higher than a HOMO energy of the EML.

15. The display device according to claim 14, wherein a difference between the HOMO energy of the EBL and that the HOMO energy of the HTL is equal to or smaller than 0.4 eV, and a difference between the HOMO energy of the EML and that the HOMO energy of the EBL is equal to or smaller than 0.4 eV.

16. The display device according to claim 11, wherein the light emitting device is a blue light emitting device.

17. A method for manufacturing a light emitting device, comprising:
    forming an electroluminescent layer (EL) comprising an emitting material layer (EML) and an electron blocking layer (EBL) on a first electrode, the EML comprising a first base material doped with a first guest material and the EBL comprising a second base material doped with a second guest material; and forming a second electrode on the EL, wherein the first guest material and the second guest material are both light emitting materials, and wherein light emitted by the first guest material has a dark blue color, and light emitted by the second guest material has a light blue color.

18. The method according to claim 17, wherein the step of forming the EL on the first electrode comprising:

forming the EBL by evaporating the second base material at a first set evaporating rate and the second guest material at a second set evaporating rate on the first electrode; and forming the EL by evaporating the first base material at a third set evaporating rate and the first guest material at a fourth set evaporating rate on the EBL.

* * * * *